United States Patent
Xu et al.

(10) Patent No.: US 10,340,889 B1
(45) Date of Patent: Jul. 2, 2019

(54) LOW NOISE NON-FOSTER CIRCUIT

(71) Applicant: HRL Laboratories, LLC, Malibu, CA (US)

(72) Inventors: Zhiwei A. Xu, Davis, CA (US); Carson R. White, Agoura Hills, CA (US); Jonathan J. Lynch, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 73 days.

(21) Appl. No.: 15/275,151

(22) Filed: Sep. 23, 2016

(51) Int. Cl.
*H01Q 1/52* (2006.01)
*H03H 11/04* (2006.01)
*H03H 11/28* (2006.01)

(52) U.S. Cl.
CPC .............. *H03H 11/04* (2013.01); *H01Q 1/52* (2013.01); *H03H 11/28* (2013.01)

(58) Field of Classification Search
CPC ........... H03H 11/04; H03H 11/28; H01Q 1/52
USPC .......................................................... 333/32
See application file for complete search history.

(56) References Cited

U.S. PATENT DOCUMENTS

| | | | |
|---|---|---|---|
| 5,479,429 | A | 12/1995 | Fernandez et al. |
| 7,245,893 | B1 | 7/2007 | Husted et al. |
| 7,859,474 | B1 | 12/2010 | Cripe |
| 9,054,798 | B2 | 6/2015 | Xu et al. |
| 2002/0044100 | A1 | 4/2002 | Jagielski et al. |
| 2006/0145762 | A1 | 7/2006 | Leete |
| 2008/0272849 | A1* | 11/2008 | Lee .................. H03H 11/32 330/301 |
| 2009/0298422 | A1 | 12/2009 | Conroy et al. |
| 2010/0144295 | A1 | 6/2010 | Kroeger |
| 2011/0149773 | A1 | 6/2011 | Lee et al. |
| 2011/0165853 | A1* | 7/2011 | Robert ................ H01Q 9/02 455/269 |

FOREIGN PATENT DOCUMENTS

| | | |
|---|---|---|
| CN | 102005648 A | 4/2011 |
| EP | 1137192 | 9/2001 |

(Continued)

OTHER PUBLICATIONS

J. G. Linvill, "Transistor Negative Impedance Converters," Proceedings of the I.R.E., vol. 41, Jun. 1953.

(Continued)

*Primary Examiner* — Stephen E. Jones
*Assistant Examiner* — Samuel S Outten
(74) *Attorney, Agent, or Firm* — Ladas & Parry

(57) ABSTRACT

A method of and an apparatus for reducing noise in a non-Foster circuit having at least a pair of cross coupled transistor devices, each transistor device of the pair of cross coupled transistor devices having a pair of current carrying electrodes. The method and apparatus involves coupling inductors with each pair of the current carrying electrodes of each of the cross-coupled transistor devices in the non-Foster circuit, the inductors also being coupled with voltage and/or current sources associated with or coupled to the non-Foster circuit. The nominal values of the inductors are selected to provide a load asymmetry, so that the load inductor in the input side of the non-Foster circuit has a larger inductance than the load inductor at the output side of non-Foster circuit.

19 Claims, 11 Drawing Sheets

(56) References Cited

FOREIGN PATENT DOCUMENTS

| EP | 2290745 | 3/2011 |
| WO | 2010-068417 | 6/2010 |

OTHER PUBLICATIONS

Stephen E. Sussman-Fort and Ronald M. Rudish, "Non-Foster Impedance Matching of Electrically-Small Antennas," IEEE Transactions on Antennas and Propagation, vol. 57, No. 8, Aug. 2009.
EPO Extended Search Report with Opinion dated Feb. 18, 2015 from EPO Application No. 12807932.4.
From U.S. Appl. No. 13/542,654 (Now U.S. Pat. No. 9,054,798) Non Final Office Action dated Oct. 8, 2014.
From U.S. Appl. No. 13/542,654 (Now U.S. Pat. No. 9,054,798) Notice of Allowance dated Apr. 14, 2015.
From U.S. Appl. No. 13/542,654 (Now U.S. Pat. No. 9,054,798) Notice of Allowance dated Apr. 28, 2015.
From U.S. Appl. No. 13/542,654 (Now U.S. Pat. No. 9,054,798) Notice of Allowance dated Feb. 3, 2015.
From U.S. Appl. No. 13/542,654 (Now U.S. Pat. No. 9,054,798) Restriction dated Aug. 1, 2014.
Li Wen-xing, et al., "Stability analysis of active antenna design based on negative impedance convertor," Applied Science and Technology, vol. 37, No. 4, and its machine English translation.
Office action from Chinese Patent Application No. 2012800334406 dated Feb. 15, 2015 and its English summary.
Office action from Chinese Patent Application No. 2012800334406 dated Sep. 26, 2014 with search report, and its English summary.
PCT International Preliminary Report on Patentability from PCT/US2012/045620 dated Jan. 7, 2014.
PCT ISR and WO from PCT/US2012/045620 dated Jan. 10, 2013.
R.R. Hoskins, "Stability of negative impedance converters," Electronics Letters, vol. 2, No. 9, Sep. 1966.

\* cited by examiner

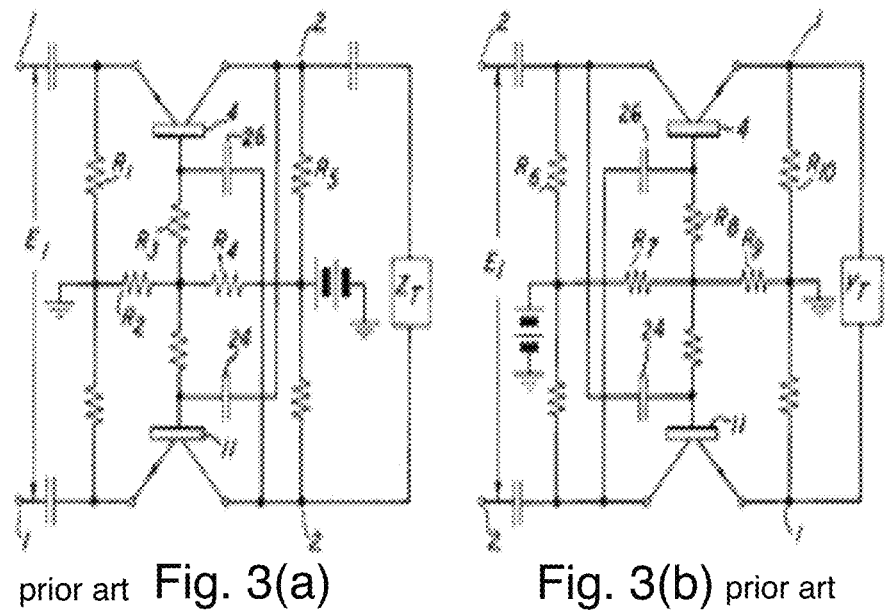
prior art Fig. 3(a)   Fig. 3(b) prior art
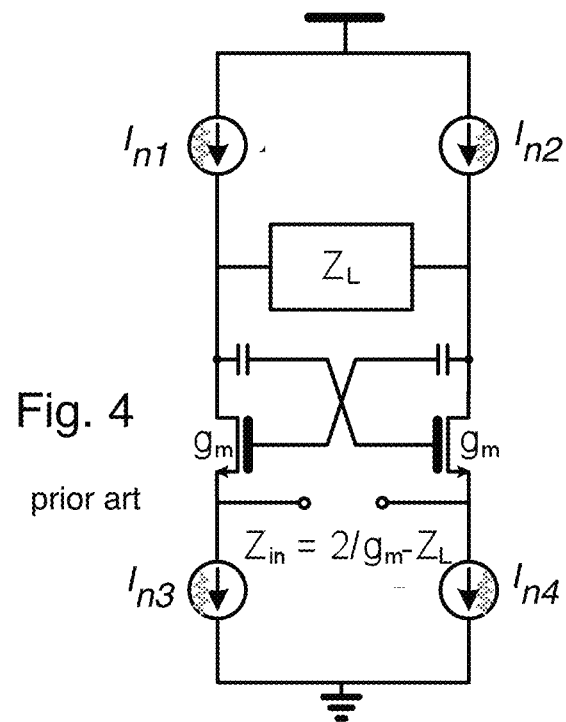
Fig. 4
prior art

US 10,340,889 B1

LOW NOISE NON-FOSTER CIRCUIT

CROSS REFERENCE TO RELATED APPLICATIONS

This application is related to U.S. patent application Ser. No. 13/542,654 filed Jul. 5, 2012, entitled "Non-foster Circuit Stabilization Circuit and Method" (now U.S. Pat. No. 9,054,798 issued Jun. 9, 2015), the disclosure of which is hereby incorporated herein by reference.

STATEMENT REGARDING FEDERALLY SPONSORED RESEARCH OR DEVELOPMENT

None.

TECHNICAL FIELD

This invention relates to improvements for non-Foster circuits which reduce their noise factors and also preferably improve their stabilities.

BACKGROUND

Non-Foster matching circuits have been proposed in the prior art. See FIGS. 1(a) and 1(b) which are discussed below and J. G. Linvill, "Transistor Negative Impedance Converters," Proc. IRE, vol. 41, June 1953 and Stephen E. Sussman-Fort and Ronald M. Rudish, "Non-Foster Impedance Matching of Electrically Small Antennas," IEEE Transactions on Antenna and Propagation, Vol. 57, August 2009.

Many people have utilized circuits in communications systems having electrically small antennas (ESA) to try to match the antenna to the receiver (or transmitter) of the communication system. Electrically small antennas have a smaller size than a full size antenna. A full size dipole antenna has a size of $$\frac{\lambda}{2}$$

while a full size monopole antenna has a size of $$\frac{\lambda}{4}$$

and a full size loop antenna has a size of $$\frac{\lambda}{3}$$

(where $\lambda$ is the wavelength of the frequency where the antenna is resonant). The term "match" in this context refers to an impedance match between the antenna and its transmitter (or receiver). If there is a mismatch between an transmitter (for example) and its antenna, then energy from the transmitter is reflected back into the transmitter, which, if large enough, can either damage the transmitter or cause its protection circuits to take it off line. As the electrically small antenna is made to be less and less the size of its equivalent full size antenna, the match becomes worse and worse. So matching circuits are devised which improve the impedance mismatch between the antenna and the transmitter (or receiver). Electrically long (or big) antennas also produce a similar mismatch but electrically small antennas are of more commercial (as opposed to theoretical) interest due to designers making cell telephones (for example) small without the need for a protuberance for the antenna.

FIGS. 1(a) and 1(b) are schematic diagrams showing two different matching circuits for use with electrically small antennas, where the circuit of FIG. 1(a) employs a passive matching circuit PMC (which does not utilize active circuit non-Forster techniques) that directly connects the electrically small antenna (such as a 6 inch monopole antenna) to a receiver having a 50 ohm input impedance and FIG. 1(b) tries to better the match by using a non-Foster matching circuit for generating a negative capacitance value to improve the impedance match between the the electrically small antenna and the receiver. In FIG. 1(b) the non-Foster circuit synthesizes a negative capacitor which is used to cancel the positive capacitor effect of the electrically small monopole antenna.

In a passive matching circuit a positive inductor can be used to offset the effective positive capacitance of the electrically small antenna but the Q of the tank circuit formed by the positive inductor and the positive capacitor of the electrically small antenna means that the combination of the positive capacitor of the electrically small antenna and an inductor has a relatively narrow bandwidth over which a suitable match occurs. Using a non-Foster matching circuit to cancel the positive capacitor of the electrically small antenna delivers a wider bandwidth match with a possibility of achieving higher gain than is possible with mere passive matching. However, the non-Foster circuit architectures used in the aforementioned prior art matching circuits often suffers from (i) inferior noise performance and (ii) stability issues, both of which issues have limited the use of prior art non-Foster circuit architectures in many applications.

FIG. 2 shows a non-Foster circuit using bipolar transistors and resistors (see also the article by Stephen E. Sussman-Fort and Ronald M. Rudish, referenced above). The circuit noise performance of this circuit is determined by the biasing resistors $R_1$ and $R_2$. Due to a >50 ohm resistance of $R_1$ or $R_2$, they contribute significant noise and the circuit demonstrates a high noise figure. In addition, traditional non-Foster circuits tend to oscillate, which mandates stable design methods.

J. G. Linvill has disclosed many non-Foster implementation architectures. See J. G. Linvill, "Transistor Negative-Impedance Converters," *Proceedings of the IRE*, vol. 41, pp. 725-729, 1953. FIGS. 3(a) and 3(b) depict two examples of same. However, these circuits still have a high noise figure and thus cannot be utilized reasonably in low noise applications. Also, as mentioned above, traditional non-Foster circuits tend to oscillate.

There are many non-Foster circuit architectures for synthesizing a negative capacitance or a negative inductance and most of them leverage positive feedback to gain that desired effect. In order to realize the required positive feedback network, bias networks are needed for supporting the required active circuitry. Unfortunately, existing bias circuits used in prior art non-Foster circuits are either realized by resistors or current sources, both of which contribute significant noise that dominates the noise performance of the resulting non-Foster negative capacitor or negative inductor. FIG. 4 shows a typical non-Foster circuit, where the noise from the bias circuit contributes 90% of the total noise of the non-Foster circuit (as determined through circuit simulation techniques). To be useful in receiver applications, it should now be apparent to the reader that a low noise bias circuit is needed to realize a low noise non-Foster circuit.

BRIEF DESCRIPTION OF THE INVENTION

In one aspect the present invention provides a method of reducing noise in a non-Foster circuit having at least a pair of cross coupled transistor devices, each transistor device having a pair of current carrying electrodes, the method comprising coupling inductors with each pair of the current carrying electrodes of each of the cross-coupled transistor devices in said non-Foster circuit, the inductors also being coupled with voltage and/or current sources associated with or coupled to said non-Foster circuit.

In another aspect the present invention provides a bias circuit for a non-Foster circuit, the bias circuit including current sources and pairs of inductors connected in series with the current sources and with transistors of the non-Foster circuit, one of said transistors being coupled to an input of said non-Foster circuit and another of said transistors being coupled to an output of said non-Foster circuit, the pair of inductors connected in series with the transistor coupled to the input of the non-Foster circuit having a total inductance which is greater than a total inductance of the pair of inductors connected in series with the transistor coupled to the output of the non-Foster circuit.

In yet another aspect the present invention provides a bias circuit for a non-Foster circuit, the non-Foster circuit being coupled in use with a DC power supply, the non-Foster circuit having a pair of transistors, one of the transistors of said pair being coupled to an input of said non-Foster circuit and the other one of the transistors of said pair being coupled to an output of said non-Foster circuit, the bias circuit including: a first pair of inductors connected with (i) current carrying electrodes of the one of the transistors of said pair coupled to an input of said non-Foster circuit and (ii) said DC power supply; and a second pair of inductors connected with (i) current carrying electrodes of the other one of the transistors of said pair coupled to an output of said non-Foster circuit and (ii) said DC power supply, such that a sum of the inductances of the first pair of inductors is greater than a sum of the inductances of the second pair of inductors.

BRIEF DESCRIPTION OF THE DRAWINGS

FIGS. 3(a) and 3(b) depict two examples of non-Foster implementation architectures proposed by J. G. Linvill.

FIG. 4 is a schematic diagram of a typical non-Foster circuit with bias circuits depicted, which use either resistors or current sources for biasing.

FIG. 5. shows N-channel devices, but P-channel enhancement mode devices may be alternatively used, as is shown by the embodiment of FIG. 5-1.

DETAILED DESCRIPTION

Figure 1A:
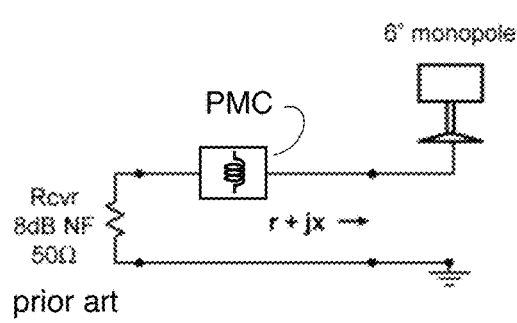
FIGS. 1(a) and 1(b) are schematic diagrams showing two different matching circuits for use with electrically small antennas (ESAs).
Figure 1B:
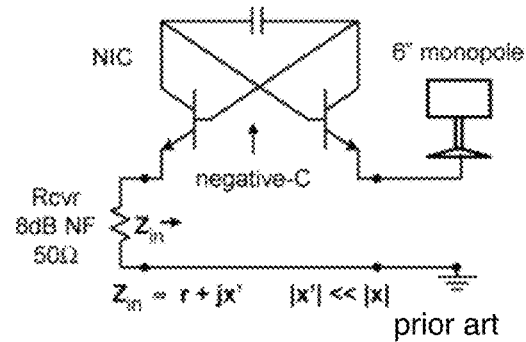
Figure 2:
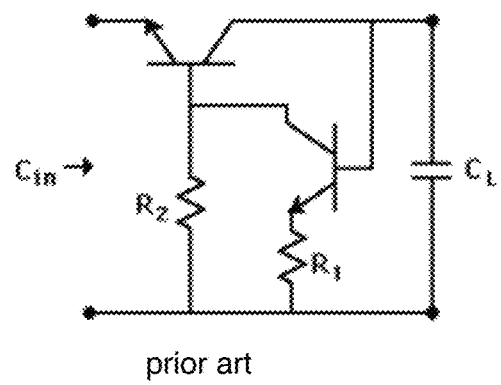
FIG. 2 is a schematic of a non-Foster circuit for synthesizing a negative capacitor, but where its resistors significantly degrade the circuit's noise performance.
Figure 5:
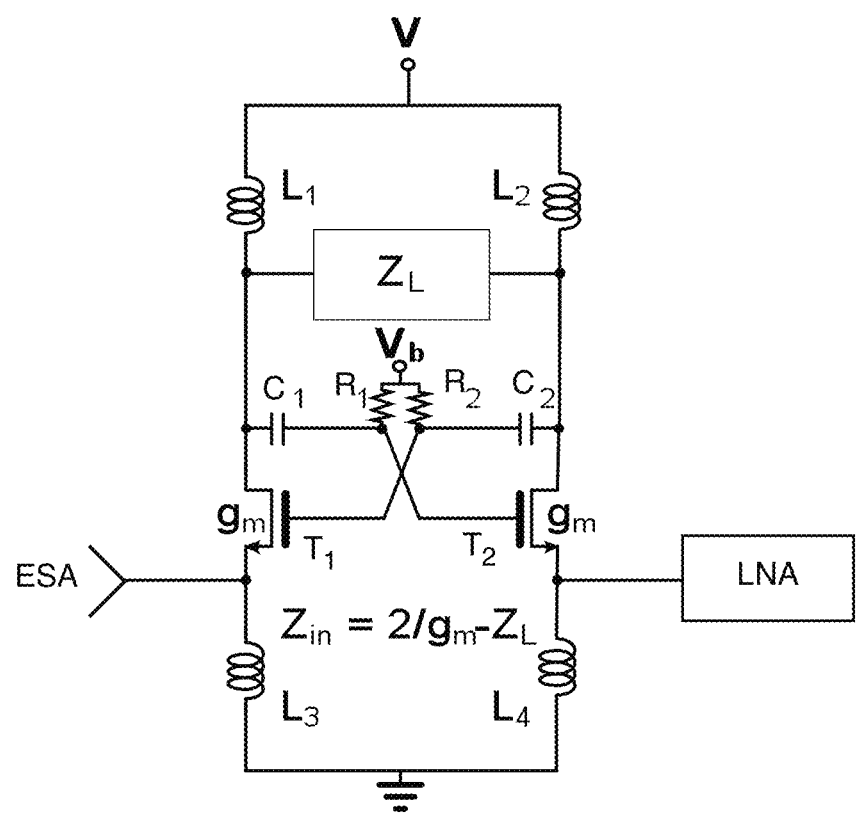
FIG. 5 is a schematic diagram of a modified version of the circuit of FIG. 4 where the prior art biasing circuits are replaced by inductors to realize a lower noise figure.

Among all the components available to a circuit designer, only the capacitor and the inductor do not generate appreciable noise. However, a capacitor cannot provide a DC path to conduct current, therefore, the only option to achieve a low noise biasing network is to use inductors in the bias circuit. FIG. 5 presents an embodiment of biasing circuit, where the bias resistors or current sources in the non-Foster circuit of FIG. 4 are replaced by four passive inductors $L_1$-$L_4$. The desired bias current can be achieved by a bias voltage $V_b$ applied to the gates of the two depicted transistors $T_1$ and $T_2$ through two large (>1 M ohm) resistors $R_1$ and $R_2$. A supply voltage V is applied to inductors $L_1$ and $L_2$.

Due to the extremely low series DC resistance from the inductors $L_1$-$L_4$ (ideally inductors have no resistance, but actual inductors which are manufactured have some DC resistance, albeit extremely low), this configuration does not suffer from the current noise of the bias circuit of the prior art embodiment of FIG. 4. And while the two bias resistors $R_1$ and $R_2$ each have large resistances (>1 M ohm), their noise is attenuated by the resistive-divider ratio of the low impedance generated by the non-Foster circuit core formed by the connection of the transistors $T_1$ and $T_2$ divided by the large resistances $R_1$ and $R_2$. The two depicted transistors $T_1$ and $T_2$ are cross coupled by means of capacitors $C_1$ and $C_2$. Capacitors $C_1$ and $C_2$ are DC blocking capacitors used for proper biasing of the transistors; they allow the drain potential to be different than the gate potential on these transistors. These two capacitors are sized such that the impedance of these capacitors should be less than the impedance of the $Z_L$ at the frequencies of interest (and preferably much less than the impedance of the $Z_L$ at the frequencies of interest).

Figures 1, 5:
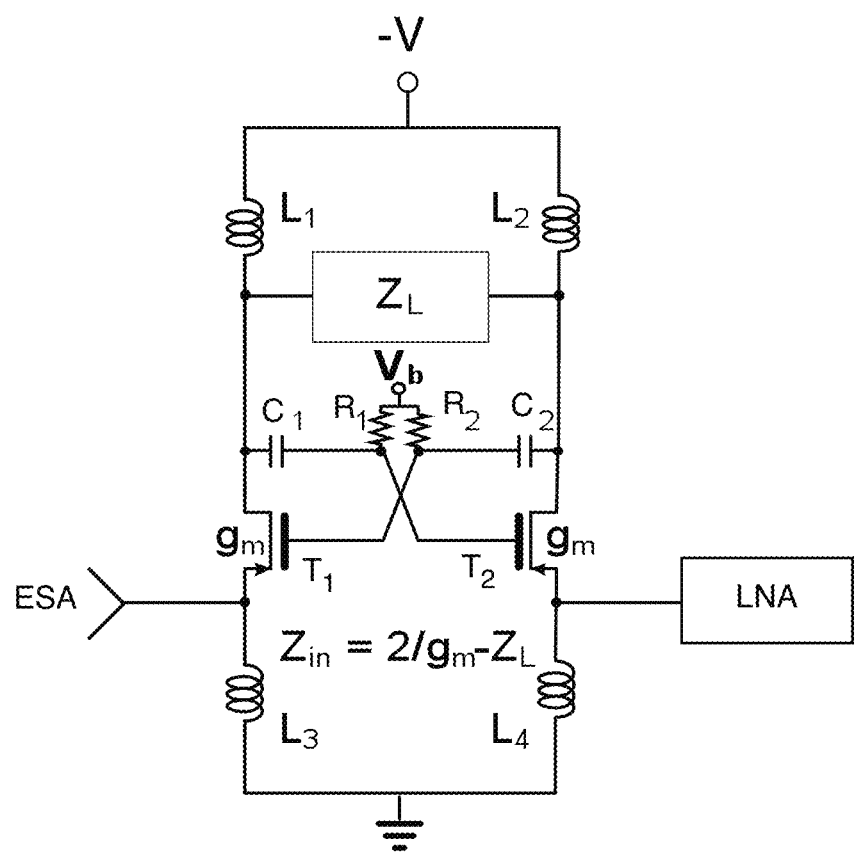

The transistor symbols used in FIG. 5 are for N-channel enhancement mode devices, but P-channel enhancement mode devices may be alternatively used, as is shown by the embodiment of FIG. 5-1. Also depletion mode transistors may be instead of the depicted enhancement mode devices in either or both of the embodiments of FIGS. 5 and 5-1, if desired.

Additionally, the loads provided by inductors $L_1$ and $L_2$ of the non-Foster circuit of FIGS. 5 and 5-1 are preferably designed asymmetrically to enhance the stability of the circuit and thereby further optimize its performance, especially when the non-Foster circuit is driving a low impedance, such as the 50 ohm input impedance of a typical receiver which, in this embodiment, has an optional Low Noise Amplifier (LNA) at its input, the LNA typically having a 50 ohm input impedance. With load asymmetry, the load inductor in the input side, $L_1$, has a larger inductance than the load inductor at the output side, $L_2$. This is because the input is connected to an electrically small antenna (ESA), typically having a relatively large impedance (greater than 50 ohms), and this load asymmetry enhances stability and performance as will now be explained in greater detail. Also inductors $L_3$ and $L_4$ preferably have nominally identical inductance values (to simplify the design), so the total (sum of) the inductance of the two inductors $L_1$ and $L_3$ connected in series with current carrying electrodes of transistor $T_1$ (and the power supply V) is thus greater than the total (sum of) inductance of the two inductors $L_2$ and $L_4$ connected in series with current carrying electrodes of transistor $T_2$ (and the power supply V).

Figure 5A:
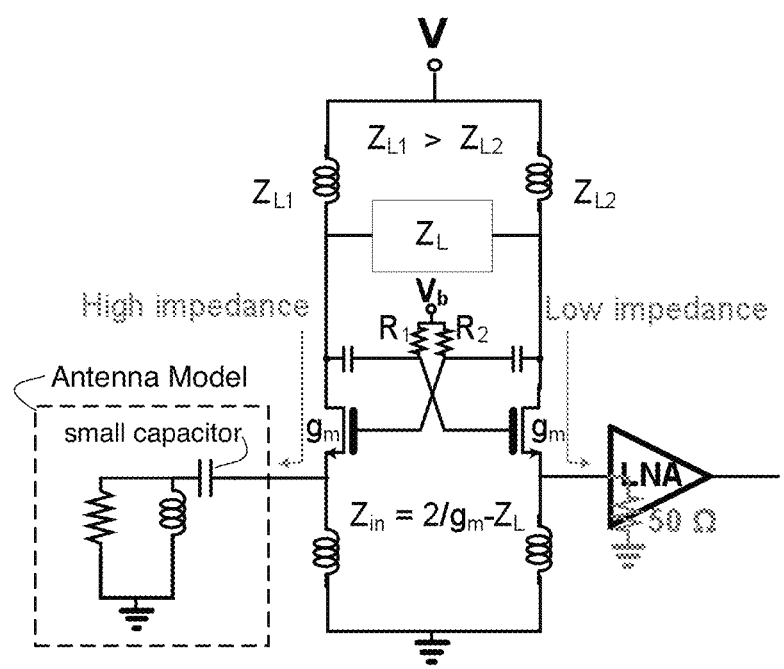
FIG. 5a is similar to FIG. 5, but shows additional details—for example, the ESA is modeled as an inductor series with a small capacitor.

FIG. 5a is similar to FIG. 5 (and somewhat less similar to FIG. 5-1 due to the conductivity change of the transistors in the embodiment of FIG. 5-1), but it will be noted that in FIG. 5a the Antenna Model for an ESA is modeled as an inductor in series with a small capacitor, which typically presents a high impedance at low frequencies to the non-Foster circuit of FIG. 5a. Also, the LNA following the non-Foster is preferably a 50 ohm matched LNA, which typically presents a low impedance (about 50 ohms) to the non-Foster circuit. So FIG. 5a illustrates the non-Foster circuit of FIG. 5 interacting with both a relatively high input impedance due to the ESA and a relatively low output impedance due to the 50 ohm input impedance of the LNA.

The inductor $L_1$ acts as a choke providing a large impedance compared to the impedance of inductor $L_2$, so the non-Foster circuit has different source impedances. The source impedance from the antenna side is relatively large and the source impedance from LNA side is relatively small, as shown in FIG. 5a and as discussed herein. These different source impedances may trigger the non-Foster circuit into an unstable regime unless $Z_{L1}$ and $Z_{L2}$ are configured as will now be described. In non-Foster matching, both arms (with $T_1$ on the antenna side and with $T_2$ on the LNA side) of the non-Foster circuit contribute gain. The non-Foster matching delivers optimum performance when both arms of the non-Foster circuit contribute similar gain. To achieve this, we select the impedance $Z_{L1}$ of inductor $L_1$ and the impedance $Z_{L2}$ of inductor $L_2$ to enhance the stability of the non-Foster circuit. The values of $Z_{L1}$ and $Z_{L2}$ are selected such that the ratios $Z_{L1}/Z_{ant}$ and $Z_{L2}/Z_{ina}$ are approximately equal (and preferably a ratio of these two ratios—namely $Z_{L1}/Z_{ant}:Z_{L2}/Z_{ina}$—falls within the range of 0.9 to 1.1 and more preferably in the range of 0.95 to 1.05.). $Z_{ant}$ is the impedance looking into the antenna while $Z_{ina}$ is the impedance looking into the LNA (or an amplifier immediately downstream of transistor $T_2$ if no LNA is utilized).

Figure 6:
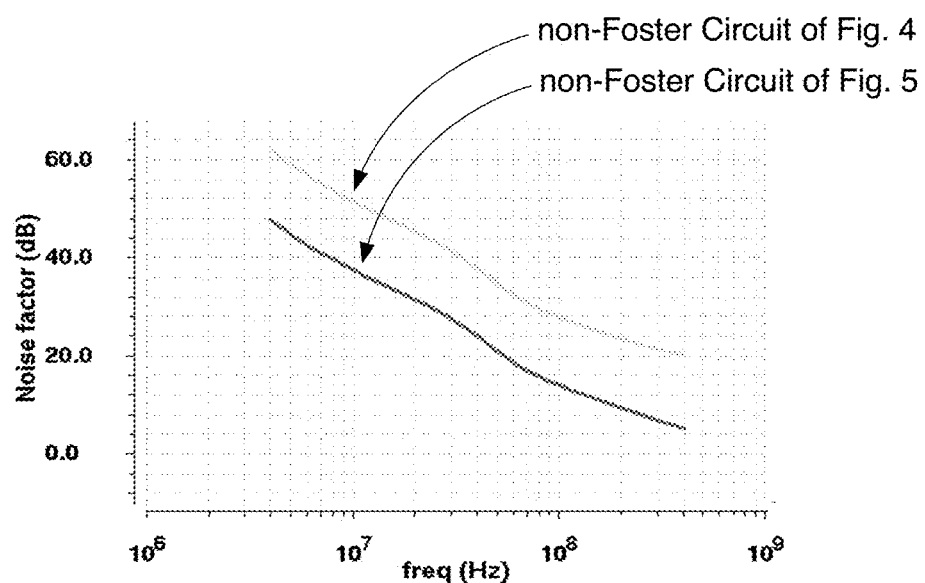
FIG. 6 is a graph showing a comparison of the noise factor from the non-Foster circuit with practical current source using transistors of FIG. 4 versus the noise factor from the non-Foster circuit with inductors in the bias circuit of FIG. 5.
Figure 7:
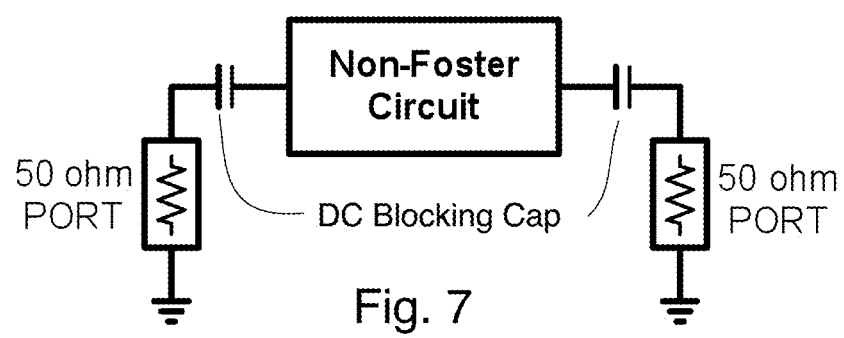
FIG. 7 depicts the circuit simulation methodology for the comparison made in FIG. 6.

FIG. 6 is a graph showing a comparison of the noise factor from the non-Foster circuit with a conventional current source using transistors of FIG. 4 versus the noise factor from the non-Foster circuit with inductors in the bias circuit of FIG. 5, where the noise factor has been simulated using the circuit simulation methodology shown in FIG. 7. In FIG. 7 DC blocking capacitors are depicted. Whether they are needed in an actual implementation depends on the details of the antenna and the receiver (LNA) attached to the non-Foster circuit. FIG. 6 clearly shows that the low noise non-Foster circuit using inductors in a bias circuit demonstrates much better noise performance than the non-Foster circuit using conventional current source as a bias circuit.

Figure 8A:
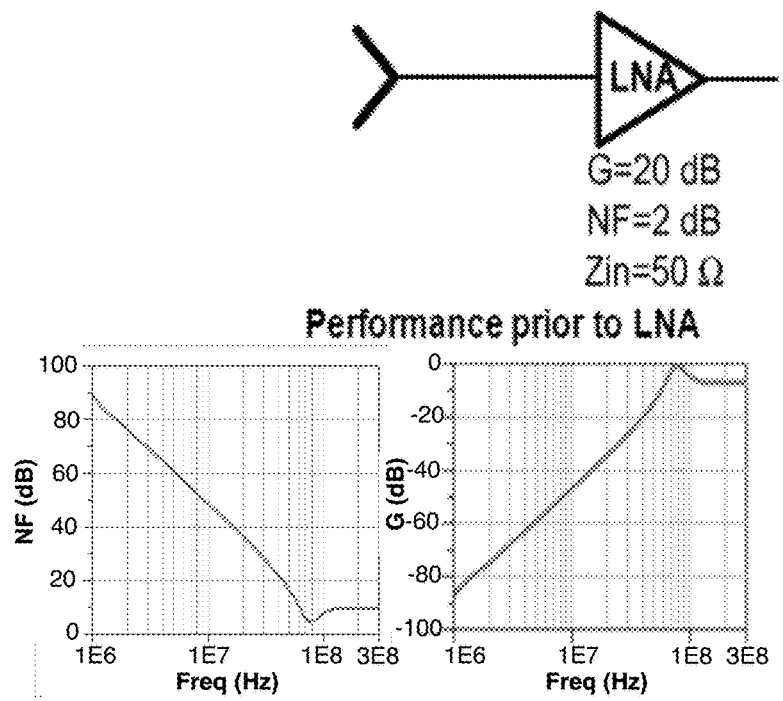
FIGS. 8(a) and 8(b) depict the performances (and this allow a comparison to be made) between a passive matching antenna and a low noise non-Foster matching an electrically short antenna with 50 ohm input impedance of a low noise amplifier (found in or associated with a receiver).
Figure 8B:
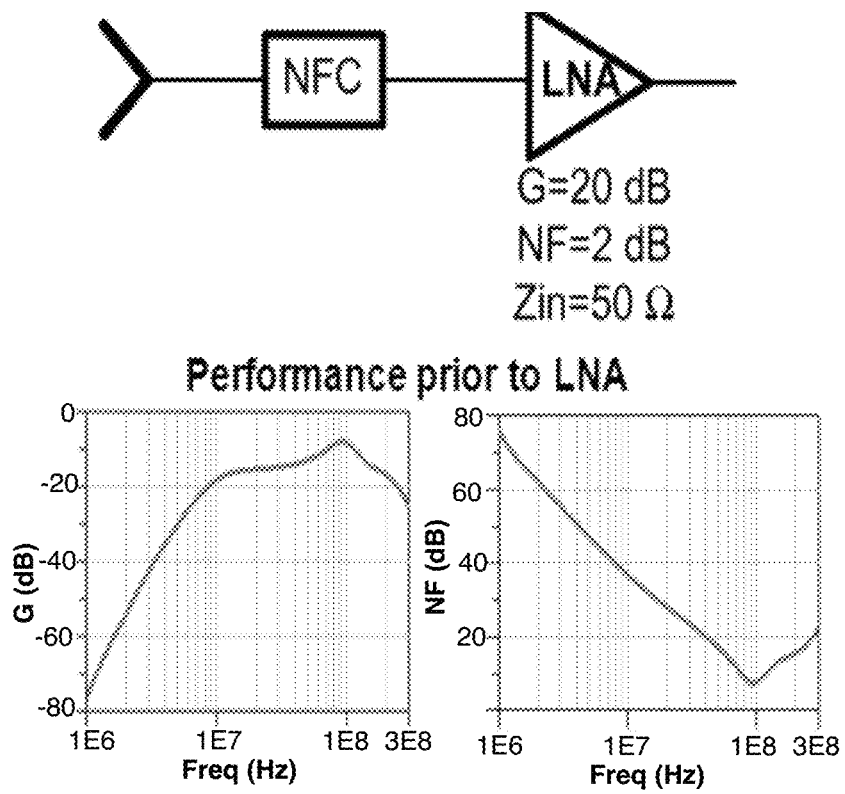

The low noise non-Foster circuit of FIGS. 5, 5-1 and 5a can be used as matching network for electrically small antennas. FIG. 8(a) shows the performance of a passive matching antenna (with 50 ohm input impedance low noise amplifier) which can be compared with FIG. 8(b) which shows the performance of the non-Foster matching circuit of FIG. 5. The simulation results suggest a non-Foster match using low noise non-Foster circuit of FIG. 5 can achieve 30 dB higher gain at 10 MHz and potentially 10 dB lower noise figure compared with passive matching of an ESA.

Figure 9:
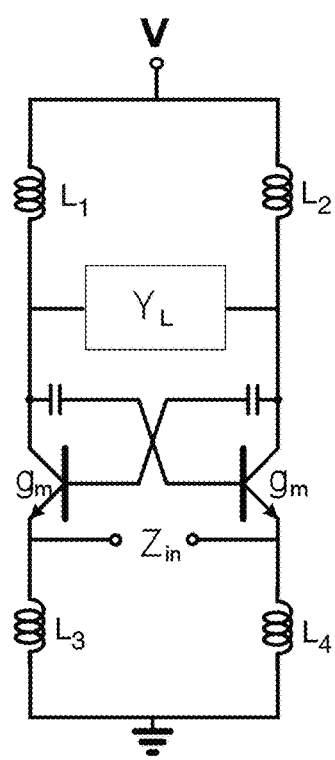
FIG. 9 is a schematic diagram of a low noise, bipolar transistor based non-Foster circuit.
Figure 10:
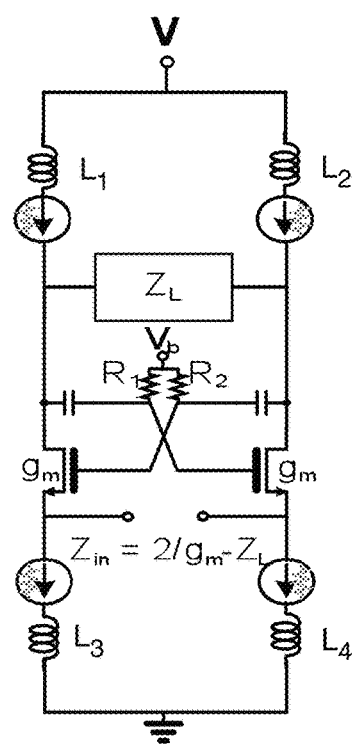
FIG. 10 depicts an embodiment of a non-Foster circuit where current sources are still used in the non-Foster circuit to define the DC bias current of the circuit, but where inductors are added to reduce the circuit's noise factor.

The disclosed low noise non-Foster circuit design using inductors can be applied to other non-Foster circuit designs, including bipolar core based non-Foster circuit (shown in FIG. 9), JFET core based non-Foster circuit or other technology based non-Foster circuit. The low noise non-Foster design can also be extended to the other architectures. FIG. 10 depicts an embodiment of a non-Foster circuit where current sources CS are used in the non-Foster circuit to define the DC bias current of the circuit, but where large inductors or RF chokes are used as the degenerative circuits of the current sources to significantly reduce the noise contribution from the depicted current sources. For example, and not by way of limitation, the inductors $L_3$ and $L_4$ may be 1000 μH, inductor $L_1$ may be 220 μH while inductor $L_2$ may be 100 μH in the embodiment of FIG. 10.

Figure 11A:
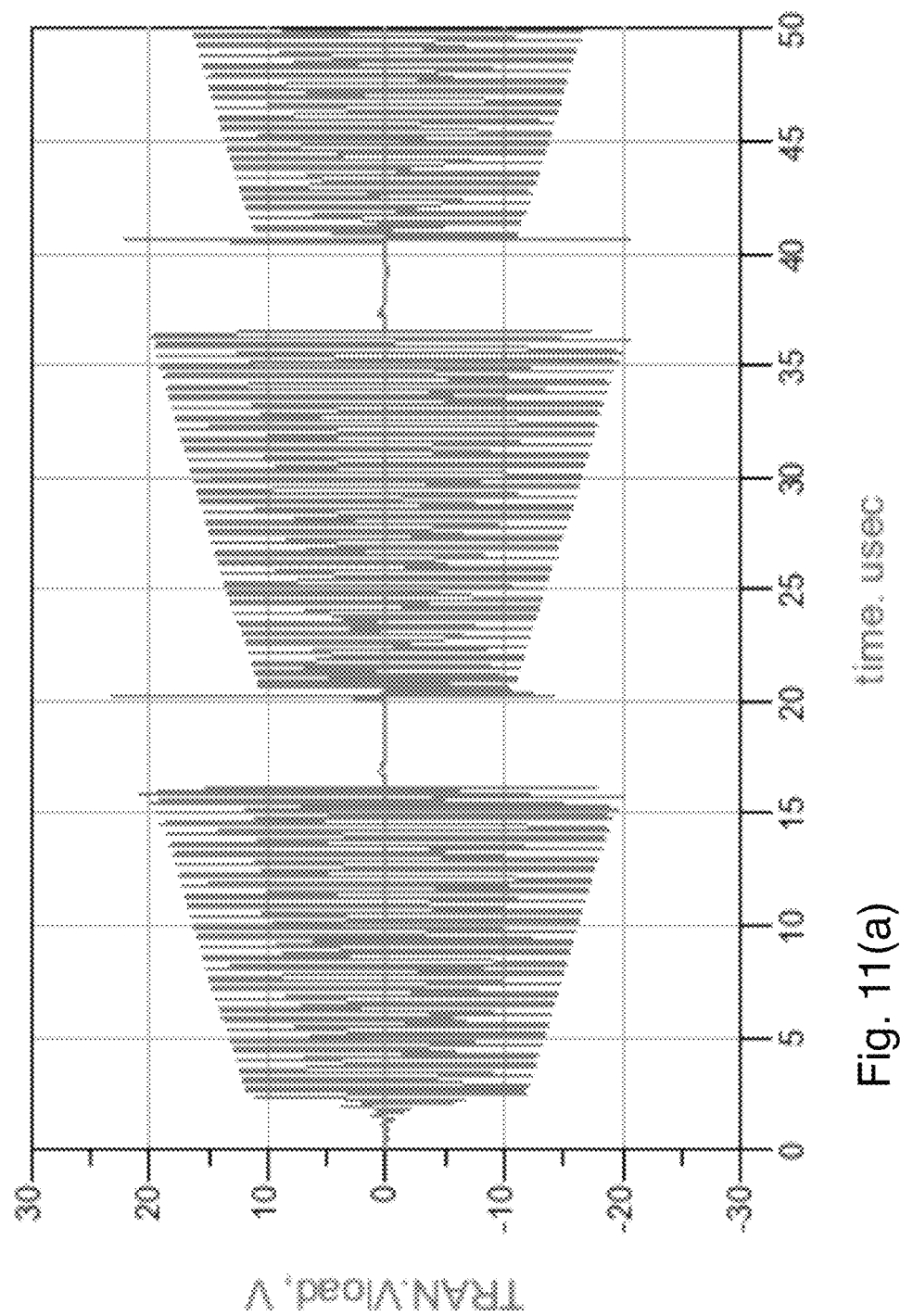
FIGS. 11(a) and 11(b) demonstrate the results of simulations to compare an unstable (prior art) non-Foster circuit (see FIG. 11(a)) which oscillates with a two-tone input with a stable non-Foster circuit with asymmetrical loads as disclosed herein which receives a two-tone input reliably without breaking into oscillation (see FIG. 11(b)).
Figure 11B:
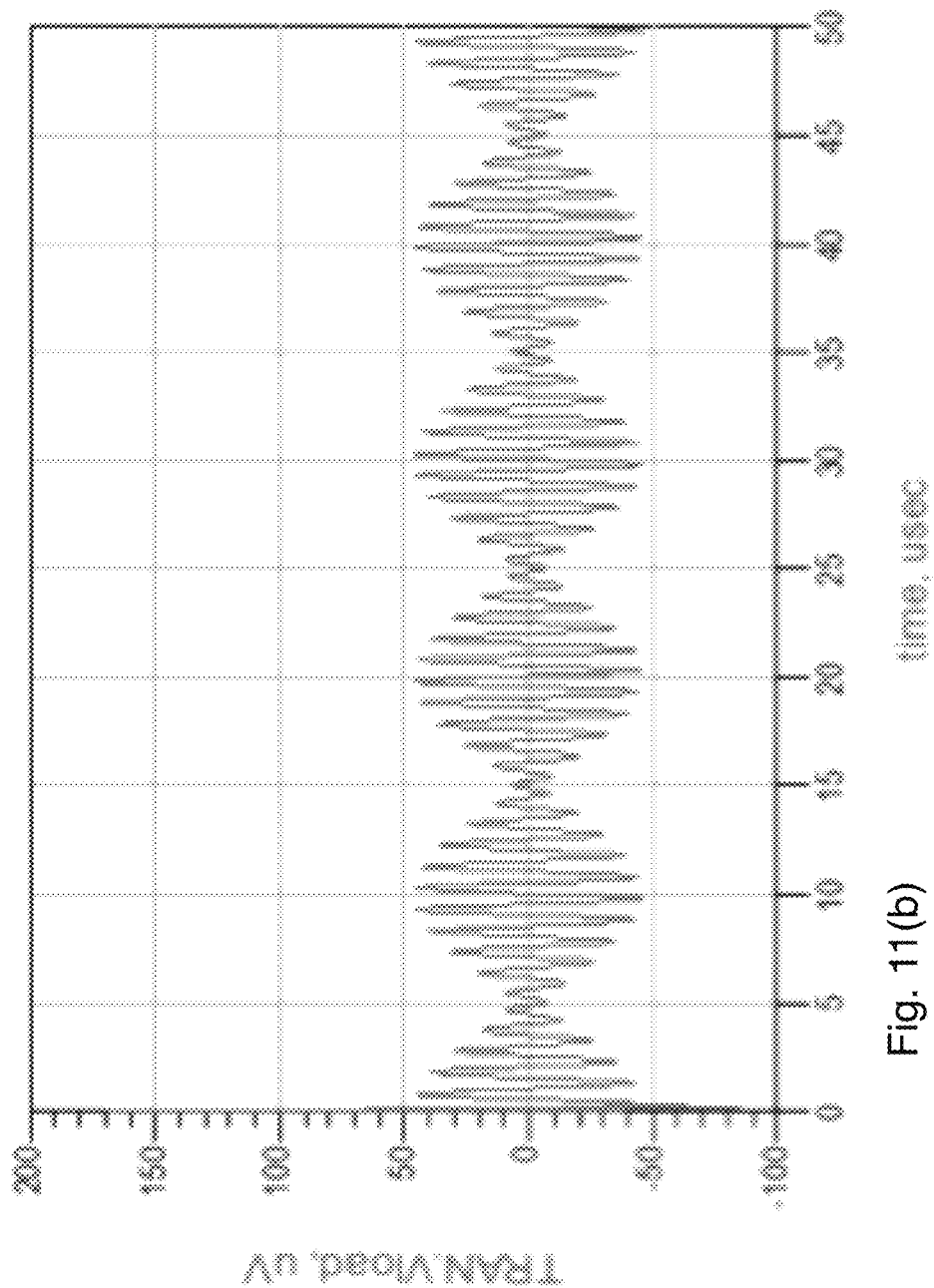

The asymmetrical load approach disclosed herein can achieve a lower noise non-Foster circuit compared to the circuit without the inductors or RF chokes. A convenient by-product of this approach is that it also reduces the tendency of non-Foster circuits to oscillate. FIGS. 11(a) and 11(b) compare simulations for an unstable non-Foster circuit (FIG. 11(a)) which oscillates with a two-tone input with a stable non-Foster circuit with asymmetrical loads as disclosed herein is receiving the two-tone input reliably without breaking into oscillation (FIG. 11(b)).

But having said that, there are instances when the asymmetrical load approach disclosed herein does not alone solve the oscillation problem. In such a situation, our previous stabilization circuit disclosed in U.S. patent application Ser. No. 13/542,654 filed Jul. 5, 2012, referenced above, can be utilized to help further stabilize such non-Foster circuits.

Non-Foster circuits can either be a (i) Negative Impedance Inverter (NII) or (ii) a Negative Impedance Converter (NIC) and each of those can be either Open-Circuit-Stable (OCS) and Short-Circuit-Stable (SCS)—before applying the improvements suggested herein. The disclosed embodiments depict Negative Impedance Converters (NICs) modified by utilizing four inductors $L_1$-$L_4$ to reduce noise. The depicted embodiments Open-Circuit-Stable (OCS) non-Foster circuits, but Short-Circuit-Stable (SCS) versions of the disclosed non-Foster circuits could be used instead and likewise Negative Impedance Inverters (NIIs) could be used instead.

Without implying a limitation, the design herein according to the principals of the present inventions is for an antenna having an impedance of greater than 50 ohms. If the antenna impedance is less than 50 ohms then persons skilled in the art will know to adjust the circuit values accordingly.

Having now described the invention in accordance with the requirements of the patent statute, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary embodiments is presented for purposes of illustration and disclosure in accordance with the requirements of the patent statute. It is not intended to be exhaustive nor to limit the invention to the precise form(s) described, but only to enable others skilled in the art to understand how the invention may be suited for a particular use or implementation. The possibility of modifications and variations will now be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ".

What is claimed is:

1. A bias circuit for a non-Foster circuit, the non-Foster circuit being coupled in use with a DC power supply, the non-Foster circuit having a pair of transistors, one of the transistors of said pair being coupled to an input of said non-Foster circuit and the other one of the transistors of said pair being coupled to an output of said non-Foster circuit, the bias circuit including:
    (a) first inductors connected with (i) current carrying electrodes of the one of the transistors coupled to an input of said non-Foster circuit and (ii) said DC power supply;
    (b) second inductors connected with (i) current carrying electrodes of the other one of the transistors coupled to an output of said non-Foster circuit and (ii) said DC power supply; and wherein a sum of the inductances of the first inductors is greater than a sum of the inductances of the second inductors.

2. The bias circuit of claim 1 further including a pair of resistors each coupled to (i) a control electrode of one of said transistors and (ii) said DC power supply.

3. The bias circuit of claim 2 furthering including a pair of capacitors each coupled to (i) a control electrode of one of said transistors and (ii) a current carrying electrode of the other one of the transistors.

4. The bias circuit of claim 3 wherein one of the inductors of said first inductors is connected to a ground associated with said DC power supply and one of the inductors of said second inductors is also connected to the ground associated with said DC power supply.

5. The bias circuit of claim 4 wherein said one of the inductors of said first inductors has a nominal value expressed in Henrys and said one of the inductors of said second inductors also has a nominal value expressed in Henrys, the nominal values of the one of the inductors of said first inductors and the one of the inductors of said second inductors are the same.

6. The bias circuit of claim 2 wherein each of said resistors has a value of at least one megohm.

7. A bias circuit for a non-Foster circuit, the non-Foster circuit being coupled in use with a power supply, the non-Foster circuit having a pair of transistors, one of the transistors of said pair being coupled to an input of said non-Foster circuit and the other one of the transistors of said pair being coupled to an output of said non-Foster circuit, the bias circuit including said power supply and inductors including at least inductors $L_1$ and $L_2$ coupled in series with said power supply, inductors $L_1$ and $L_2$ being arranged as asymmetrical impedances so that their corresponding impedance values $Z_{L1}$ and $Z_{L2}$ are selected such that the ratios $Z_{L1}/Z_{ant}$ and $Z_{L2}/Z_{lna}$ are approximately equal to each other, where $Z_{ant}$ is an impedance looking into an antenna coupled, in use, to said input of the non-Foster circuit while $Z_{lna}$ is an impedance looking into an amplifier connected, in use, to said output of the non-Foster circuit.

8. The bias circuit of claim 7 wherein the inductors $L_1$ and $L_2$ are each coupled in series with said power supply and a first current carrying electrode of each of said transistors and further including at least additional inductors $L_3$ and $L_4$ which are each coupled in series with said power supply and a second current carrying electrode of each of said transistors.

9. The bias circuit of claim 8 wherein additional inductors $L_3$ and $L_4$ have nominally identical inductance values.

10. The bias circuit of claim 8 wherein a total (sum of) the inductance of the inductors $L_1$ and $L_3$ connected in series with current carrying electrodes of said one of said transistors of said pair and the power supply is greater than the total (sum of) inductance of the two inductors $L_2$ and $L_4$ connected in series with current carrying electrodes of said other of said transistors of said pair and the power supply.

11. The bias circuit of claim 7 wherein the ratio $(Z_{L1}/Z_{ant})$ $(Z_{L2}/Z_{lna})$ falls within a range of 0.90 to 1.10 and more preferably in the range of 0.95 to 1.05.

12. An apparatus for biasing a non-Foster circuit having at least a pair of cross coupled transistor devices, each transistor device having a pair of current carrying electrodes, the apparatus comprising an inductor directly coupled with each of the current carrying electrodes of each of the cross-coupled transistor devices in said non-Foster circuit, the inductors also being coupled with voltage and/or current sources associated with or coupled to said non-Foster circuit.

13. The apparatus of claim 12 wherein each transistor device has a control electrode which is capacitively coupled with one of the current carrying electrodes of another one of said transistor devices.

14. The apparatus of claim 12 wherein the non-Foster circuit has an input coupled with an electrically small antenna and an output coupled with an amplifier having a low input impedance, the low input impedance of the amplifier being substantially lower than an impedance of the electrically small antenna, the input of the non-Foster circuit having one of said at least a pair of cross coupled transistor devices associated therewith along and the output of the non-Foster circuit also having one of said at least a pair of cross coupled transistor devices associated therewith, the inductors coupled with the one of said at least a pair of cross coupled transistor devices associated said input of the non-Foster circuit having an combined larger inductance than the inductors coupled with the one of said at least a pair of cross coupled transistor devices associated said output side of the non-Foster circuit.

15. A method of reducing noise in a non-Foster circuit having at least a pair of cross coupled transistor devices, each transistor device having a pair of current carrying electrodes, the method comprising directly coupling an inductor with each of the current carrying electrodes of each of the cross-coupled transistor devices in said non-Foster circuit, the inductors also being coupled with voltage and/or current sources associated with or coupled to said non-Foster circuit.

16. The method of claim 15 wherein each transistor device also has a control electrode which is capacitively coupled with one of the current carrying electrodes of another one of said transistor devices.

17. The method of claim 15 wherein the non-Foster circuit has an input side coupled with an electrically small antenna and an output side coupled with an amplifier having a low input impedance, the low input impedance of the amplifier being substantially lower than an impedance of the electrically small antenna, the input side having one of said at least a pair of cross coupled transistor devices associated therewith along and the output side also having one of said at least a pair of cross coupled transistor devices associated therewith, the inductors coupled with the one of said at least a pair of cross coupled transistor devices associated said input side having an combined larger inductance than the inductors coupled with the one of said at least a pair of cross coupled transistor devices associated said output side.

18. The method of claim 15 wherein the pair of cross coupled transistor devices comprise a pair of cross coupled field effect transistor devices, the current carrying electrodes of each of which comprise source and drain electrodes.

19. The method of claim 15 wherein the pair of cross coupled transistor devices comprise a pair of cross coupled bipolar transistor devices, the current carrying electrodes of each of which comprise collector and emitter electrodes.

* * * * *